United States Patent [19]

Takahashi et al.

[11] Patent Number: 4,590,148
[45] Date of Patent: May 20, 1986

[54] PROCESS FOR PRODUCING LIGHT SENSITIVE LITHOGRAPHIC PLATE REQUIRING NO DAMPENING SOLUTION

[75] Inventors: Hiroshi Takahashi; Hiroyuki Tamaki; Chikashi Ohishi; Keisuke Shiba, all of Kanagawa, Japan

[73] Assignee: Fuji Photo Film Co., Ltd., Kanagawa, Japan

[21] Appl. No.: 710,892

[22] Filed: Mar. 12, 1985

[30] Foreign Application Priority Data

Mar. 12, 1984 [JP] Japan .................. 59-46873

[51] Int. Cl.⁴ .................. G03F 7/02; G03C 5/00
[52] U.S. Cl. .................. 430/303; 430/272; 430/961; 430/950; 430/532; 430/327; 430/494; 430/937; 430/271
[58] Field of Search .......... 430/303, 272, 961, 950, 430/532, 327, 494, 937, 271

[56] References Cited

U.S. PATENT DOCUMENTS

| | | | |
|---|---|---|---|
| 3,894,873 | 7/1975 | Kobayashi et al. | 430/303 X |
| 4,254,209 | 3/1981 | Abe et al. | 430/272 |
| 4,288,521 | 9/1981 | Kojima et al. | 430/961 X |
| 4,292,389 | 9/1981 | Kojima et al. | 430/950 X |
| 4,358,522 | 11/1982 | Fujita et al. | 430/303 X |

FOREIGN PATENT DOCUMENTS

| | | |
|---|---|---|
| 2308711 | 2/1973 | Fed. Rep. of Germany ...... 430/532 |
| 0055212 | 5/1978 | Japan ................................. 430/272 |

OTHER PUBLICATIONS

Richard G. Crystal and Frank J. Walton, "Process for Preparing Photocurable Waterless Lithographic Printing Masters", *Xerox Disclosure Journal*, vol. 1, No. 2, Feb. 1976, p. 15.

*Primary Examiner*—John E. Kittle
*Assistant Examiner*—Cynthia Hamilton
*Attorney, Agent, or Firm*—Sughrue, Mion, Zinn, Macpeak and Seas

[57] ABSTRACT

A process for producing a light-sensitive lithographic plate requiring no dampening solution comprising (1) carrying out corona discharge treatment on the surface of a silicone rubber layer of a light-sensitive lithographic plate requiring no dampening solution wherein the silicone rubber layer is the top layer, (2) spraying a solution or dispersion containing a non-volatile solid component on said silicone rubber layer, and (3) drying to provide fine projection patterns on said silicone rubber layer.

5 Claims, No Drawings

PROCESS FOR PRODUCING LIGHT SENSITIVE LITHOGRAPHIC PLATE REQUIRING NO DAMPENING SOLUTION

FIELD OF THE INVENTION

The present invention relates to a process for producing a light-sensitive lithographic plate requiring no dampening solution. Particularly, it relates to a process for producing a light-sensitive lithographic plate requiring no dampening solution which is excellent in the reproduction of the original image and close in contact with the original (film original).

BACKGROUND OF THE INVENTION

Light-sensitive lithographic plates requiring no dampening solution have a silicone rubber layer as a top layer of the ink repellent non-image part, see, for example, U.S. Pat. Nos. 3,511,178 and 3,865,583, Japanese Patent Application (OPI) No. 94503/73 and British Pat. Nos. 1,146,618 and 1,419,643. The term "OPI" as used herein refers to a "published unexamined Japanese patent application".

In order to form an image on these light-sensitive lithographic plates requiring no dampening solution they are exposed to active rays through an original. In such a case, it is necessary to bring the original in close contact with the surface of the light-sensitive lithographic plate requiring no dampening solution so as to faithfully reproduce the original. For this purpose, a process which comprising placing the light-sensitive lithographic plate requiring no dampening solution and the original in piles between a rubber sheet and a press glass and making vacuous the space between the rubber sheet and the press glass to being them in close contact (hereinafter, referred to as a "vacuum contact process") is generally used.

However, in the prior light-sensitive lithographic plates requiring no dampening solution having a silicone rubber layer of the top layer as an ink repellent layer, since the surface thereof is very smooth and the silicone rubber is very excellent in close contact, if the original film is brought in contact with the silicone rubber layer, the contact part is firmly fixed and it becomes difficult to change the position of the original film. Further, when air bubbles occur, the air bubbles coming into the central part are very difficult to remove, even if the air is sucked from the circumference of the light-sensitive lithographic plate requiring no dampening solution by the vacuum contact process. Therefore, in order to bring the original in completely close contact with the entire face of the light-sensitive lithographic plate requiring no dampening solution, a very long time is required, particularly, when it is of a large size. In an extreme case, close contact can not be attained, even if much time is taken.

Such a requirement of much time for vacuum contact is not economical because efficiency of the plate making operation is reduced. In addition, there is a fatal problem that the original can not be reproduced faithfully if exposure is carried out in such a state that close contact of the original is insufficient. When using a light-sensitive lithographic plate requiring no dampening solution having a light-sensitive layer which generates gas by exposure, the gas generated by imagewise exposure accumulates between the plate and the original without getting away and damages the close contact of them, whereby reproduction of faithful image becomes difficult.

In order to solve the former problem, it has been proposed in Japanese Patent Application (OPI) No. 55343/80 to provide a polyolefin or polyester film having an uneven face on the surface so that a smooth face thereof touches with the silicone rubber layer. However, laminating the plastic film on the surface of the plate is, of course, not only technically difficult but also economically disadvantageous. Further, if a plastic film is provided on the surface of the plate, a distance between the original and the light-sensitive image-forming layer (hereinafter, referred to as "light-sensitive layer") becomes greater in carrying out exposure. Accordingly, there is a problem that so-called indistinct printing is easily caused by an exposure apparatus in which ideal parallel rays can not be obtained, and an image faithful to the original is difficult to reproduce. In addition, in the case of using a light-sensitive layer having a property of decomposing and releasing gas by exposure, if a plastic film is provided, there is a serious problem similar to the case of bringing the original in close contact with the silicone rubber layer, i.e. gas generated by exposure pushes up the plastic film to increase the distance from the original and, consequently, indistinct printing is formed.

In order to solve such a problem, a process which comprises spraying a solution or dispersion containing a non-volatile component directly on the silicone rubber layer has been disclosed in Japanese Patent Application (OPI) No. 27150/81. However, in this process, since the aqueous solution or dispersion is merely sprayed on the surface of the silicone rubber layer and dried, a finely uneven surface sticking to the surface of the silicone rubber layer comes off by a very small force, for example, by softly touching the surface of the silicone rubber layer with a finger. Thus it does not stably stick until the printing step wherein presence of the finely uneven surface is required. Moreover, there is a new problem that the finely uneven surface remaining be comes off from the surface of the silicone rubber layer in the resin of a powder, which adheres to the original film to stain the film.

As a result of earnest studies in order to solve such problems, the present inventors have attained the follwing invention.

SUMMARY OF THE INVENTION

Namely, the present inventors have found that a planographic plate requiring no dampening solution and having fine projection patterns stably fixed to the surface of a silicone rubber layer is obtained by a process which comprises processing a light-sensitive lithographic plate requiring no dampening solution having a silicone rubber layer as a top layer by corona discharge, spraying a solution or dispersion containing a non-volatile component on the activated surface of said silicone rubber layer, and drying.

DETAILED DESCRIPTION OF THE INVENTION

The light-sensitive lithographic plate requiring no dampening solution to which the process of the present invention is applied may be that which has a light-sensitive silicone rubber layer backed with a support or may be that which has a known light-sensitive layer backed with a support which is present under a silicone rubber layer through, if necessary, an adhesive layer.

As supports, paper having a thickness of 10μ to 2 mm, preferably, about 50 to 500μ, plastic films or sheets, metal plates, etc. are suitably used, but supports having rubber elasticity and cylindric supports may be used, too.

The light-sensitive silicone rubber layer is that wherein the silicone rubber layer itself is sensitive to light. In this case, a light-sensitive layer is not necessary. As light-sensitive silicone rubbers, there are compounds obtained by dealcoholating condensation of dimethylpolysiloxane having end-OH groups and γ-methacryloxypropyl trimethoxysilane or monocinnamoyl diethoxysilane and compounds obtained by adding a bisazide compound to polydiorganosiloxane or reacting polydiorganosiloxane with acryloyl chloride or p-azidobenzoate, etc.

A light-sensitive silicone rubber layer wherein a known light-sensitive substance is blended with silicone rubber can be used, too.

The light-sensitive layer is a layer having a property of light-hardening or light-solubilizing by irradiating with active rays. The thickness thereof is arbitrary, but it is preferred to be about 100μ or less and, preferably about 0.1 to 10μ.

As the light-sensitive materials, those having the following constitution are suitably used.

(1) Compositions containing an unsaturated monomer having a boiling point of 100° C. or more which is nonvolatile at room temperature, or an oligomer thereof, a light-sensitizer, a thermal polymerization inhibitor, and, if necessary, a filler for giving a shape retentive property at room temperature and a small amount of additives.

As unsaturated monomers, acrylic acid esters and methacrylic acid esters such as ethylene glycol diacrylate (dimethacrylate), polyethylene glycol diacrylate (dimethacrylate), hydroxyethyl acrylate (methacrylate), hydroxypropyl acrylate (methacrylate), glycidyl acrylate (methacrylate), 1-chloro-2-hydroxyethyl acrylate (methacrylate), dimethylaminoethyl acrylate (methacrylate), etc., acrylamide derivatives such as ethylenebisacrylamide, N-methylolacrylamide, methoxymethylacrylamide, etc., esters of allyl alcohol such as triallyl cyanurate, triallyl phosphate, diallyl phthalate, diallyl maleate, etc. and styrene derivatives can be used.

As light-sensitizers, benzophenone derivatives, benzoin derivatives, anthraquinone derivatives, aldehydes, ketones, sulfur compounds, halogen compounds and dyes such as Methylene Blue or riboflavin, etc. can be used.

As thermal polymerization inhibitors, hydroquinone derivatives, phenol derivatives, nitro substituted benzenes, tertiary amines and phenothiazine derivatives are used.

As fillers or additives, there are fine powders of inorganic substances such as colloidal silica, calcium carbonate, magnesium carbonate, iron oxide, etc., vinyl polymers such as polyvinyl acetate, poly acrylic (methacrylic) acid esters, polyethylene having a molecular weight of several thousands, polypropylene, polyvinyl chloride, polyvinylidene chloride, etc., and resol phenol type, urea type, melamine type, epoxy type and unsaturated polyester type resins before hardening.

The amount of the unsaturated monomers and oligomers used in the present composition is preferably 1.0 to 99.9 wt % based on the solids of the composition. The light-sensitizers, the thermal polymerization inhibitors and fillers are used preferably in an amount of 0.1 to 20.0 wt %, 0.01 to 1.0 wt % and 5 to 70 wt % based on the solid of the composition.

(2) Compositions composed of high molecular compounds containing the group

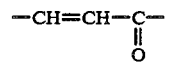

in the main chain or a side chain of the polymer.

Examples of the compounds include those composed of, as a main component, a light-sensitive polymer such as polyesters, polyamides or polycarbonates containing

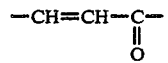

as a light-sensitive group in the main chain or a side chain of the polymer (for example, compounds described in U.S. Pat. Nos. 3,030,208, 3,707,373 and 3,453,237); those composed of, as a main component, a light-sensitive polyester derived from a (2-propenylidene)malonic acid compound such as cinnamylidene malonic acid, etc. and difunctional glycol (for example, light-sensitive polymers described in U.S. Pat. Nos. 2,956,878 and 3,173,787); and cinnamic acid esters of hydroxyl group containing polymer such as polyvinyl alcohol, starch, cellulose or analogues thereof (for example, light-sensitive polymers described in U.S. Pat. Nos. 2,690,966, 2,752,372 and 2,732,301).

(3) Light-hardenable diazo resin or azide resin and, if necessary, a light-sensitizer and a small amount of fillers or additives.

As light-hardenable diazo resin, there are zinc chloride double salts of condensates composed of diazo amine such as p-diazophenylamine, p-diazomonoethylaniline or p-diazobenzylethylaniline, etc. and formaldehyde.

As light-hardenable azide resin, there are azidophthalic acid esters or azidobenzoic acid esters of polyvinyl alcohol, and esters of styrene-maleic acid anhydride copolymer and aromatic azide type alcohol such as β-(4-azidophenol)ethanol, etc.

As light-sensitizers, fillers and additives, those described in (1) can be used.

The amount of the light-hardenable diazo resin and the light-hardenable azide resin used in the present composition is each preferably 5 to 50 wt % based on the solids of the composition.

(4) Compositions composed of o-quinonediazide compounds.

Particularly desirable o-quinonediazide compounds are o-naphthoquinonediazide compounds, which have been described in many publications including, for example, U.S. Pat. Nos. 2,766,118, 2,767,092, 2,772,972, 2,859,112, 2,907,665, 3,046,110, 3,046,111, 3,046,115, 3,046,118, 3,046,119, 3,046,120, 3,046,121, 2,046,122, 3,046,123, 3,061,430 3,102,809, 3,106,465, 3,635,709 and 3,647,443, and can be suitably used. Of these, o-naphthoquinonediazidosulfonic acid esters or o-naphthoquinonediazidocarboxylic acid esters of aromatic hydroxy compounds and o-naphthoquinonediazidosulfonic acid amides or o-naphthoquinonediazidocarboxylic acid amides of aromatic amine compounds are preferred. Particularly, substances obtained by esterification reaction of a condensate of pyrogallol and acetone with o-naphthoquinonediazidosulfonic acid, described in U.S. Pat. No. 3,635,709, substances obtained by esterification reaction of polyester having end-hydroxyl groups with o-naphthoquinonediazidosulfonic acid or o-naphthoquinonediazidocarboxylic acid, described in U.S. Pat. No. 4,028,111, and substances obtained by esterification reaction of homopolymer of p-hydroxystyrene or copolymer of p-hydroxystyrene and other copolymerizable monomers with o-naphthoquinonediazidosulfonic acid or o-naphthoquinonediazidocarboxylic acid, described in British Pat. No. 1,494,043, are remarkably suitable. The amount of o-quinonediazide used in the present composition is 30 to 100 wt % based on the solids of the composition.

The silicone rubber layer used in the present invention generally has a thickness of about 0.5 to 10μ, preferably about 1 to 3μ, which is composed of linear organopolysiloxane having a molecular weight of 8000 to 600,000 having the following repeating unit, as a main component.

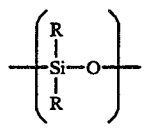

Here, R is an alkyl group having 1 to 10 carbon atoms or a phenyl group, and 60% or more of R is preferred to be methyl group. Such linear organopolysiloxane can be sparsely cross-linked to form silicone rubber by carrying out heat treatment after adding organic peroxide.

To the silicone rubber layer, a cross-linking agent is added. As the cross-linking agents, there are acetoxysilane, ketooximesilane, alkoxysilane, aminosilane, amidosilane, etc., which are used for the so-called room temperature (low temperature) hardening silicone rubbers. Generally, they are combined with linear organopolysiloxane having end-hydroxyl groups to form silicone rubbers of the type of deacetic acid, deoxime, dealcohol, deamine or deamide. To the silicone rubber, an amount of 0.5 to 5 wt % of organotin compound based on the silicone rubber etc. is usually added as a catalyst.

It is advantageous to provide, if necessary, an anchor coating layer between the support and the light-sensitive layer or the silicone rubber layer in order to improve adhesion between the base and the light-sensitive layer or the light-sensitive layer and the silicone rubber layer, or to prevent halation, or to provide an adhesive layer in order to improve adhesion between the light-sensitive layer and the silicone rubber layer.

Corona discharge treatment in the present invention can be carried out by any process known, for example, processes disclosed in Japanese Patent Publication Nos. 5043/73 and 51905/72 and Japanese Patent Application (OPI) Nos. 28607/72, 83767/74, 41770/76 and 131576/76, etc. Electric discharge frequency is preferred to be in a range of 50 Hz to 5000 KHz, preferably 5 KHz to 500 KHz. Too small an electric discharge frequency is not desirable, because stabilized electric discharge is not obtained and pinholes are formed on the object to be processed. Moreover, too high a frequency is not disirable, because a special apparatus for impedance matching is required which increase the cost of the apparatus. With respect to processing intensity for the object to be processed, in the ordinary case, it is preferred to be in a range of 0.001 KV.A.minute/m² to 5.0 KV.A.minute /m², preferably 0.1 KV.A.minute/m² to 1.0 KV.A.minute/m². Gap clearance between an electrode and a dielectric roll is preferred to be in a range of 0.5 mm to 2.5 mm, preferably 1.0 mm to 2.0 mm.

As resin solutions or dispersions of a non-volatile solid component to be sprayed on the activated surface of the silicone rubber layer, there are those obtained by dissolving or dispersing in a suitable solvent resins, for example, gum arabi, glue, gelatine, casein, celluloses (for example, viscose, methyl cellulose, ethyl cellulose, hydroxyethyl cellulose, hydroxypropylmethyl cellulose, carboxymethyl cellulose, etc.), soluble starch, polyvinyl alcohol, polyethylene oxide, polyacrylic acid, polyacrylamide, polyvinyl methyl ether, epoxy resin, phenol resin (particularly, novolak type phenol resin is suitable), polyamide (including polyamides soluble in alcohols having 1 to 6 carbon atoms such as ethanol, methanol, isopropanol, butanol, t-butanol, etc.), polyvinyl butyral, polyacrylate copolymers (copolymers described in Japanese Patent Application (OPI) Nos. 34558/82, 182636/83, and 163944/83), etc. Two or more of these resins can be used together.

The resin is contained in the solution or the dispersion in an amount of 20 to 95 wt %, preferably 30 to 80 wt % based on the solution or the dispersion.

These solutions or dispersions may contain matting agents. Examples of matting agents include silicon dioxide, zinc oxide, titanium oxide, zirconium oxide, glass powder, alumina, starch, polymer particles (for example, particles of polyethylene, polymethyl methacrylate, polystyrene, phenol resin, etc.) and matting agents described in U.S. Pat. Nos. 2,701,245 and 2,992,101. Two or more of them can be used together.

In the solutions or dispersions, silane coupling agents or organotitanates, etc. may be incorporated as adhesive aids for the purpose of controlling adhesion of the fine projection patterns on the surface of the silicone rubber layer activated by corona discharge.

The matting agents, silane coupling agents and organotitanates may be contained in the solution or the dispersion in an amount of 5 to 80 wt %, 0.1 to 5 wt % and 0.1 to 5 wt %, preferably 2 to 70 wt %, 0.5 to 2 wt % and 0.5 to 2 wt %, respectively.

The average height of the projections on the surface of the silicone rubber layer of the present invention is preferred to be in a range of about 0.5 to 50μ, preferably 1 to 10μ, and amount of it is in a range of 1 to 1000/mm², preferably 5 to 500/mm².

The light-sensitive lithographic plate requiring no dampening solution having fine projection patterns on the silicone rubber layer obtained as described above is developed by a conventional manner. In case where a resin which is poorly-soluble or insoluble in the developing solution is used as a non-volatile solid component, it sometimes remains on the silicone rubber layer of the non-image part without dissolution to cause stains. In such case, it is possible to remove it with a solvent which does not corrode the light-sensitive layer and the silicone rubber layer or with water. By incorporating an amount of 0.01 to 0.1 wt % of acid in the solvent or water, the effect of controlling the surface of the silicone rubber layer can be further improved.

When the light-sensitive lithographic plate requiring no dampening solution of the present invention is used, close contact with the original (original film) in carrying out exposure is improved and the time required for making close contact is greatly shortened. In addition, image can be faithfully reproduced. Further, the film is not contaminated because the fine projection patterns do not come off.

In the following non-limiting example, the present invention is illustrated in greater detail.

EXAMPLE 1

The surface of a polyethylene terephthalate film (thickness: 0.2 mm) was subjected to corona discharge treatment under a condition of 0.083 KVA minute/m$^2$, and a coating solution having the following composition was applied to said film by wheeler coating so as to form a light-sensitive layer having a dry weight of 1.0 g/m$^2$, and dried.

1:1 polycondensation product of p-phenylene diacrylic acid ester and 1,4-bis(hydroxyethyloxy)cyclohexane: 1.00 part by weight
3-Methyl-2-benzoylmethylene-$\beta$-naphthothiazoline: 0.06 parts by weight
N-$\beta$-(Aminoethyl)-$\gamma$-aminopropyltrimethoxysilane: 0.10 parts by weight
Microlis Blue 4GK (Ciba-Geigy): 0.20 parts by weight
Methyl cellosolve acetate: 7.5 parts by weight
Toluene: 7.5 parts by weight
Methylglycol: 7.5 parts by weight To the light-sensitive layer, the following silicone rubber solution was applied by wheelar coating so as to form a silicone rubber layer having a dry weight of 2.0 g/m$^2$, and dried.

Shinetsu Silicone KS-709: 33.4 parts by weight
Catalyst for hardening Shinetsu Silicone: Catalyst PS: 0.4 parts by weight
Isoper G (EXXON Chemical): 150 parts by weight Then, the surface of the silicone rubber layer was processed with a solid state corona processor: model 6KVA produced by Pillar Corp, at 10 m/minute. In this case, according to reading values of electric current and voltage, the surface of the silicone rubber layer was processed at 0.5 KVA minute/m$^2$. Electric discharge frequency for processing was 9.6 KHz, and the gap clearance between the electrode and the dielectric roll (made of Hypalon produced by E.I. du Pont de Nemours & Co. Inc.) was 1.6 mm.

To the surface of the silicone rubber layer processed by electric discharge as described above, a solution having the following resin composition was applied by spraying at a distance of 30 cm from the surface of the plate, and dried to form fine projection patterns on the silicone rubber layer. In this case, the number, height and width of projections were each 30 to 70/mm$^2$, 2 to 6$\mu$ and 20 to 150$\mu$, respectively. This plate is hereinafter called Printing plate A.

10 wt % aqueous solution of 5:3:2 (molar ratio) copolymer of methyl acrylate, ethyl acrylate and sodium 2-acrylamido-2-methylpropanesulfonate: 300 parts by weight
N-$\beta$-(aminoethyl)-$\gamma$-aminopropyltrimethoxysilane: 0.6 parts by weight On the other hand, the above described solution of resin was applied by spraying by the same manner as described above to the above described light-sensitive lithographic plate requiring no dampening solution without treatment by corona discharge, and thereafter was dried to form fine projection patterns on the silicone rubber layer. This plate is hereinafter called Printing plate B.

When the surface of printing plate A was rubbed with a finger, the fine projection patterns did not come off and they were stably fixed. On the contrary, in printing plate B, they easily came off by rubbing with a finger.

A positive film was brought in contact with the printing plate A obtained as described above. After being exposed to light at 30 counts by ET26V UDNS ULTRA-PLUS FLIP-TOP PLATE MAKER produced by nuArc Company Inc. it was immersed in a developing solution composed of 82 parts by weight of Isoper H (EXXON Chemical), 8 parts by weight of polypropylene glycol (degree of polymerization: 400) and 10 parts by weight of diethyl succinate for 1 minute. When it was gently rubbed with a developing pad, only the silicone rubber layer of the nonexposed part was removed. Using this plate, when printing was carried out with a black ink: TOYO KING ULTRA TUK Aqualess G produced by Toyo Ink Co. by means of Heidelberg GTO printing press from which the wetting solution feeding apparatus was taken off, a slight stain was formed on the non-image part. When the surface of another printing plate produced as described above was processed with a diluted aqueous solution of hydrochloric acid and printing was carried out, prints having no stain were obtained.

EXAMPLE 2

A light-sensitive solution was prepared by dissolving 7 g of 2-diazo-1-naphthol-5-sulfonic acid ester of polyhydroxyphenyl obtained by polycondensation of acetone and pyrogallol (compound described in U.S. Pat. No. 3,635,709) and 3 g of cresol novolak resin obtained from only m-cresol (Sumitomo Durez Company, Ltd.) in a mixture of 120 g of methyl cellosolve acetate and 60 g of methyl ethyl ketone. It was applied to a support which was previously prepared by applying a solution obtained by dissolving 1 part by weight of a silane coupling agent: SH-6020 produced by Toray Silicone Co. (N-$\beta$-(aminoethyl)-$\gamma$-aminopropyltrimethoxysilane) in 500 parts by weight of ethanol to an aluminum plate degreased at 50° C. for 60 seconds using 10% sodium hydroxide aqueous solution followed by washing and drying, so as to result in 1 g/m$^2$ and dried.

Then, a solution prepared by dissolving 1 part by weight of a silane coupling agent: SH-6020 produced by Toray Silicone Co. (N-$\beta$-(aminoethyl)-$\gamma$-aminopropyltrimethoxysilane) in 500 parts by weight of n-heptane was filtered and applied to the above described light-sensitive layer, and then a solution prepared by dissolving 5 parts by weight of Toray Silicone SH-781RTV (one-liquid RTV deacetic acid type) in 95 parts by weight of Isoper G (EXXON Chemical Co.) was applied so as to result in a dry weight of 2 g/m$^2$. After it was dried at 100° C. for 2 minutes, it was allowed to stand for a night in the dark to complete hardening. The resulting light-sensitive lithographic plate requiring no dampening solution was treated by corona discharge under a condition of 0.5 KVA minute/m$^2$ by an oscillator produced by Softal Elektronik GmbH which was equipped with a dielectric revolving roll suitable for processing an electrically conductive film and an earth roll.

To the surface of the light-sensitive lithographic plate requiring no dampening solution processed by discharge as described above, a solution having the same resin composition as in Example 1 was applied by spraying by the same manner as in Example 1, and dried.

A negative film was brought in contact with the resulting light-sensitive lithographic plate requiring no dampening solution having fine projection patterns on the silicone rubber layer. After being exposed to light at 15 counts by ET 26V UDNS ULTRA-PLUS FLIP-TOP PLATE MAKER produced by nuArc Company Inc, it was immersed in a developing solution composed of 50 parts by volume of n-propyl alcohol and 50 parts by volume of water for 1 minute and developed by gently rubbing with a developing pad.

When printing was carried out using this plate with a black ink: TOYO KING ULTRA TUK Aqualess G produced by Toyo Ink Co. by means of a Heidelberg GTO printing press from which a dampening solution feeding apparatus was taken off, the 5th step of a step tablet produced by Fuji Photo Film Co. printed simultaneously with imagewise exposing was fully printed and halftone wedge of 300 lines showed ideal reproduction. Thus, distinct prints having no stain on the non-image part were obtained.

While the invention has been described in detail and with reference to specific embodiments thereof, it will be apparent to one skilled in the art that various changes and modifications can be made therein without departing from the spirit and scope thereof.

What is claimed is:

1. A process for producing a light-sensitive lithographic plate requiring no dampening solution comprising (1) carrying out corona discharge treatment on the surface of a silicone rubber layer of a light-sensitive lithographic plate requiring no dampening solution wherein the silicone rubber layer is the top layer, (2) spraying a solution or dispersion containing a non-volatile solid component on said silicone rubber layer, and (3) drying to provide fine projection patterns, wherein said fine projection patterns have an average height in the range of about 0.5 to 50μ and are present in an amount of 1 to 1000/mm² on said silicone rubber layer.

2. The process as claimed in claim 1, wherein said silicone rubber layer is composed of a linear organopolysiloxane having the following repeating units as a main component:

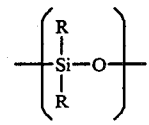

wherein R is an alkyl group having 1 to 10 carbon atoms or a phenyl group wherein 60% or more of R is a methyl group.

3. The process as claimed in claim 1, wherein the electric discharge frequency of said Corona discharge treatment is in the range of 50 Hz to 5,000 KHz.

4. The process as claimed in claim 1, wherein said non-volatile solid component is selected from the group consisting of gum arabi, gelatine, casein, celluloses, soluble starch, polyvinyl alcohol, polyethylene oxide, polyacrylic acid, polyacrylamide, polyvinyl methyl ether, epoxy resin, phenol resin, polyamide, polyvinyl butyral, and polyacrylate copolymers.

5. The process as claimed in claim 1, wherein the average height of said fine projections is in the range of about 1 to 10μ and are present in an amount of 5 to 500/mm².

* * * * *